(12) United States Patent
Inoue et al.

(10) Patent No.: US 6,858,084 B2
(45) Date of Patent: Feb. 22, 2005

(54) PLATING APPARATUS AND METHOD

(75) Inventors: Hiroaki Inoue, Tokyo (JP); Koji Mishima, Fujisawa (JP); Tsutomu Karimata, Yokohama (JP); Kenji Nakamura, Fujisawa (JP); Moriji Matsumoto, Fujisawa (JP); Junji Kunisawa, Yamato (JP)

(73) Assignee: Ebara Corporation, Tokyo (JP)

( * ) Notice: Subject to any disclaimer, the term of this patent is extended or adjusted under 35 U.S.C. 154(b) by 170 days.

(21) Appl. No.: 09/983,401

(22) Filed: Oct. 24, 2001

(65) Prior Publication Data

US 2003/0019426 A1 Jan. 30, 2003

(30) Foreign Application Priority Data

Oct. 26, 2000 (JP) ........................................ 2000-327798
Oct. 26, 2000 (JP) ........................................ 2000-327801

(51) Int. Cl.[7] .............................................. B05C 11/00
(52) U.S. Cl. ........................................ 118/666; 118/64
(58) Field of Search ................................ 118/50, 52, 64, 118/66, 504, 666, 724, 725, 600, 602, 505, 72; 427/437, 282; 438/638, 909, 913, 908; 204/239, 241; 205/224, 118, 125, 81, 82, 135, 207, 209

(56) References Cited

U.S. PATENT DOCUMENTS 5,830,805 A * 11/1998 Shacham-Diamand et al.
6,544,585 B1 * 4/2003 Kuriyama et al.
6,599,563 B2 * 7/2003 Grunwald

FOREIGN PATENT DOCUMENTS

| JP | 64-079377 | 3/1989 |
|---|---|---|
| JP | 02-310393 | 12/1990 |
| JP | 10-280157 | 10/1998 |
| JP | 11-92949 | 4/1999 |
| JP | 2000-064087 | 2/2000 |
| JP | 2001-192845 | 7/2001 |

* cited by examiner

Primary Examiner—Brenda A. Lamb
(74) Attorney, Agent, or Firm—Wenderoth Lind & Ponack, L.L.P.

(57) ABSTRACT

The present invention relates to an electroless plating apparatus which can reduce an amount of a plating liquid to be used, maintain a stable plating process, be downsized, reduce an apparatus cost, form a film having a uniform thickness over an entire surface, and prevent a plating liquid from being deteriorated due to a temperature rise. The present invention comprises: a holding device for holding a substrate with a surface, to be plated, facing upwardly; a plating liquid holding mechanism for sealing a periphery of the surface, to be plated, of the substrate held by the holding device; an electroless plating treatment liquid supply device for supplying an electroless plating liquid to the surface, to be plated, of the substrate sealed by the plating liquid holding mechanism to allow supplied electroless plating liquid to be held on the substrate; and a heating apparatus provided below the substrate.

8 Claims, 10 Drawing Sheets

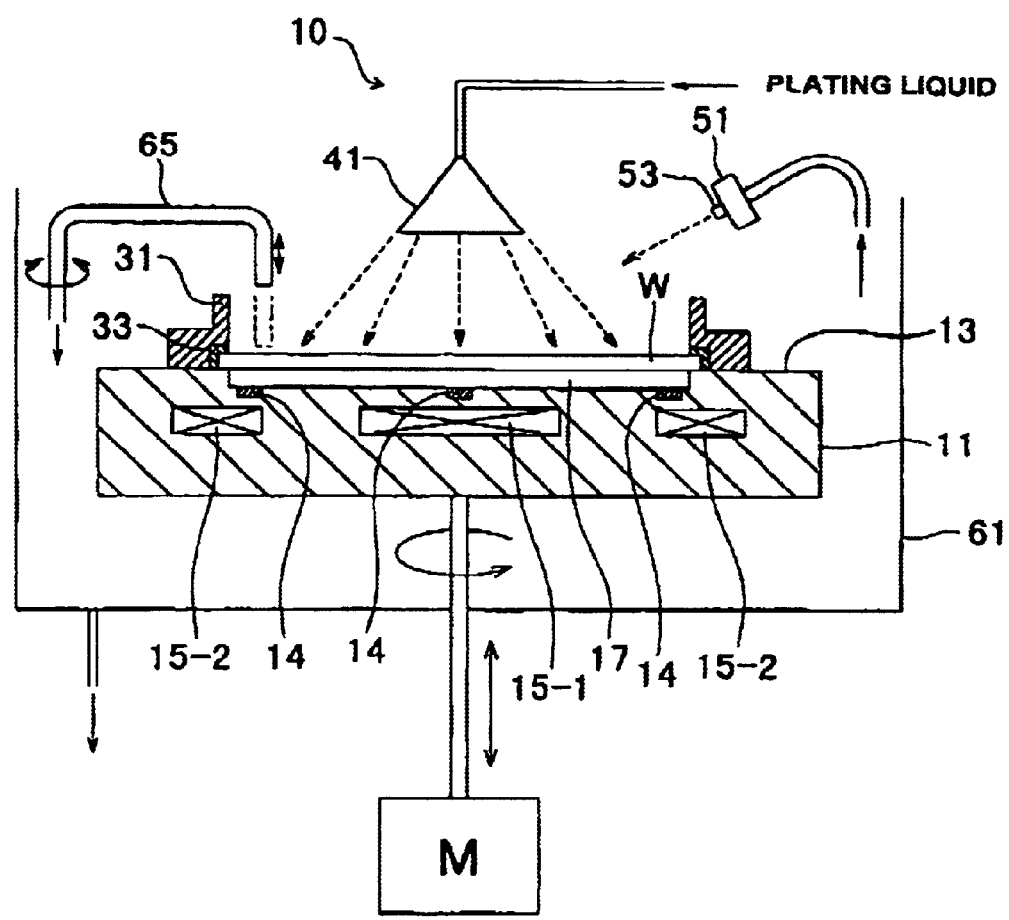

PLATING APPARATUS AND METHOD

BACKGROUND OF THE INVENTION

1. Field of the Invention

The present invention relates to plating apparatus and method which are preferably used for forming interconnects on a semiconductor substrate (including forming a seed layer, and forming a reinforcing seed layer on a seed layer for a purpose of reinforcing the seed layer), an interconnection-protective film, and a diffusion-preventive film.

2. Description of the Related Art

Conventionally, aluminum or aluminum alloy have been generally used as a material for forming interconnect circuits on semiconductor substrates. As integrated density has increased in recent years, there is a demand for employing a material having a higher conductivity as an interconnect material. Thus, there has been proposed a method in which copper or copper alloy is used as an interconnect material, and is filled into interconnect pattern trenches formed in a semiconductor substrate by plating the substrate.

There have been known various processes including CVD (chemical vapor deposition), sputtering, and the like to fill interconnect pattern trenches with copper or copper alloy. However, in a case where a metal layer comprises copper or copper alloy, i.e., a copper interconnect is formed, the CVD process is costly for forming the copper interconnect, and it is impossible for the sputtering process to fill copper or copper alloy into interconnect pattern trenches having a high aspect ratio, i.e., a high ratio of depth to width. A plating process does not have these drawbacks and is most effective to fill copper or copper alloy into interconnect pattern trenches.

On the other hand, instead of an electroless plating apparatus for performing electroless plating treatment by providing a plurality of units for carrying out a plating process, a pretreatment process associated with plating, and a cleaning process, there has been proposed an electroless plating apparatus for performing these various processes by a single unit. FIG. 10 is a schematic view showing this kind of electroless plating apparatus. As shown in FIG. 10, the elecetoless plating apparatus comprises a holding apparatus (holding device) 81 rotated by a motor M, and a cover 83 disposed around a periphery of a semiconductor substrate W placed on and held by the holding apparatus 81. In the electroless plating apparatus, while the semiconductor substrate W is rotated by the motor M at a position indicated by dotted lines in FIG. 10, a plating liquid is supplied from a plating tank 87 to a central upper surface of the semiconductor substrate W by a pump P. While the plating liquid is spreading on an entire upper surface of the semiconductor substrate W under centrifugal force caused by rotation of the semiconductor substrate W, for thereby plating the semiconductor substrate W, the plating liquid which has fallen from the semiconductor substrate W is returned from a plating liquid recovery section 85 of the cover 83 to the plating tank 87, and is then circulated.

On the other hand, the semiconductor substrate W which has been plated is lowered to a position indicated by solid lines in FIG. 10 and rotated at such position, and cleaning water is supplied to the semiconductor substrate W from a non-illustrated cleaning water supply apparatus (cleaning water supply device), whereby plating liquid is rinsed from the surface of the semiconductor substrate W, and used cleaning water is collected by a cleaning liquid recovery section 86 from which collected cleaning water is drained.

However, the above conventional electroless plating apparatus also the following various problems:

① Because a plating liquid is always supplied onto a surface, to be plated, of a semiconductor substrate, a large amount of plating liquid is circulated and used. When a large amount of plating liquid is circulated and used, a large-sized pump is required. Thus, a liquid temperature maintaining apparatus which prevents a temperature rise of the liquid due to heat generation of the pump is needed to be provided, thereby increasing an apparatus cost and enlarging the apparatus, and hence increasing a cost for a clean room in which this apparatus is accommodated.

② Because plating liquid is always circulated and used, by-products are accumulated in a system performing electroless plating, and a stable plating process cannot be maintained. In order to perform a stable plating process, an apparatus for analyzing and adjusting a plating liquid is needed to be installed, thus increasing an apparatus cost and a clean room cost.

③ Because a large amount of plating liquid is circulated and used, particles tend to be generated from respective components of the apparatus. Thus, it is necessary to install a filter F in a circulation path so as to increase an apparatus cost and a clean room cost.

④ When plating is performed in such a state that plating liquid is always supplied only to a certain portion of the surface to be plated, a thickness of plated film at the portion where the plating liquid has been supplied is smaller than a thickness of plated film at other portions, as confirmed by experiments. Thus, uniformity of a film thickness on the surface deteriorates. A reason for this is that flow rate and thickness of the plating liquid, and the like at the portion where the plating liquid has been supplied is different from those at other portions, and hence plating reaction states are different from each other.

⑤ In order to perform electroless plating, a temperature of a reaction surface between the surface to be plated and plating liquid is required to be maintained at a predetermined constant temperature. Therefore, a device for constantly heating a large amount of the plating liquid to a temperature optimum for a plating reaction is required to be provided, thus increasing an apparatus cost and a clean room cost. Further, since a temperature rise of plating liquid is necessary at all times, deterioration of the plating liquid is hastened.

⑥ A semiconductor substrate is always rotated, and hence heat dissipation due to peripheral speed of the semiconductor substrate causes a remarkable temperature drop, resulting in a failure to obtain a stable plating process.

⑦ In a case where a plating liquid is supplied to the surface to be plated not by dropping but by spraying, temperature control of the plating liquid becomes uncertain, and a stable plating process cannot be obtained.

Further, if an interconnect pattern having a uniform thickness should be formed on the semiconductor substrate by electroless copper plating, it is essential to maintain a plating temperature at respective plating reaction portions of the semiconductor substrate at a predetermined high temperature. In this case, FIG. 11 is a view showing measured results, obtained by experiments, of relationships between plating liquid temperature and film thickness in electroless copper plating.

Plating conditions in the experiments are as follows:
CD Specifications of the Plating Liquid
$CuSO_4 \cdot 5H_2O$ 2.5 g/l EDTA.2Na 20 g/l
NaOH 4 g/l
HCHO (37%) 5 ml/l
② Samples Used in Plating
Semiconductor substrate having a diameter of 8 inches wherein a barrier layer of TaN (20 nm) and a Cu seed layer (full plating) are formed on silicone.
③ Plating Time
60 seconds An electroless plating was applied to semiconductor substrates under the above plating conditions. As a result, as shown in FIG. 11, it was found that when a temperature of the plating liquid varied by 1° C. during a plating time period of one minute, a difference of film thickness amounted to approximately 1.8 nm, and as plating temperature increased, thickness of plated film increased. Therefore, as described above, in order to perform electroless plating so as to form a plated film having a desired thickness and a uniform thickness over an entire surface of the semiconductor substrate, the plating liquid must be maintained at a predetermined high temperature, and temperatures at respective portions of the semiconductor substrate must be controlled to be uniform during plating reaction.

Thus, in the conventional plating apparatus, there has been employed a mechanism for bringing a plating liquid, whose temperature has been increased in advance to a plating treatment temperature or higher, into contact with a surface, to be plated, of a semiconductor substrate and keeping a surface of plating reaction warm by virtue of a heater or a lamp.

However, in the conventional method, it has been difficult to keep the surface of plating reaction of the semiconductor substrate warm at a predetermined temperature accurately at all times during plating reaction. Particularly, in a case of a single wafer processing plating apparatus in which semiconductor substrates are plated one by one, a temperature of the semiconductor substrates must be increased one by one. In this case, it has been difficult to heat a semiconductor substrate to a predetermined temperature accurately and quickly and keep the semiconductor substrate at the predetermined temperature.

SUMMARY OF THE INVENTION

The present invention has been made in view of the above drawbacks. It is therefore a first object of the present invention to provide an electroless plating apparatus which can reduce an amount of a plating liquid to be used, maintain a stable plating process, be downsized, reduce an apparatus cost, form a film having a uniform thickness over an entire surface, and prevent a plating liquid from being deteriorated due to a temperature rise.

Further, a second object of the invention is to provide plating apparatus and method which can accurately keep a surface of plating reaction of a substrate warm at a predetermined temperature at all times during plating reaction, perform stable and reliable plating, and improve throughput.

In order to achieve the first object, according to an aspect of the present invention, there is provided an electroless plating apparatus comprising: a holding device for holding a substrate with a surface, to be plated, facing upwardly; a plating liquid holding mechanism for sealing a periphery of the surface, to be plated, of the substrate held by the holding device; an electroless plating treatment liquid supply device for supplying an electroless plating liquid to the surface, to be plated, of the substrate sealed by the plating liquid holding mechanism to allow supplied electroless plating liquid to be stored on the substrate; a heating device provided below the substrate; and a gap (space) formed between the heating device and the substrate. This gap (space) constitutes a uniform temperature forming section by being filled with gas or liquid.

With this arrangement, treatment of the surface to be plated can be performed using a small amount of electroless plating treatment liquid, a pump of a small size can be used as a pump for supplying the electroless plating treatment liquid, the electroless plating apparatus can be made compact, and cost for a clean room housing the apparatus can be reduced. Since a small amount of electroless plating treatment liquid is used, heating and warmth retention of the electroless plating treatment liquid can be easily and promptly performed.

Further, because the gap (uniform temperature forming section) which can be filled with gas or liquid is provided between the heating device and the substrate, even if a heating device having a non-uniform surface temperature distribution, for example, a wire-like heater arranged in a ring (spiral) shape is used, the gap (uniform temperature forming section) can have the same temperature at an entire plane, and a heating temperature at respective portions of the substrate can be made uniform. In the electroless plating apparatus, a pretreatment liquid, a catalytic treatment liquid, an electroless plating liquid or the like can be used as an electroless plating treatment liquid while switching any of these liquids, and hence a series of electroless plating steps can be carried out in a single cell.

According to an aspect of the present invention, there is provided an electroless plating apparatus comprising: a holding device for holding a substrate with a surface, to be plated, facing upwardly; a plating liquid holding mechanism for sealing a periphery of the surface, to be plated, of the substrate held by the holding device; an electroless plating treatment liquid supply device for supplying an electroless plating liquid to the surface, to be plated, of the substrate sealed by the plating liquid holding mechanism to allow supplied electroless plating liquid to be stored on the substrate; a heating device provided in the vicinity of the substrate for heating the substrate in its entirety; and a temperature control device for controlling a temperature of the heating device; wherein the heating device has a plurality of divided zones and temperatures in respective zones are controlled respectively by the temperature control device.

In many cases, cooling rates of a heated substrate held by the holding device are different at respective portions of the substrate, and the substrate normally begins to be cooled from an outer periphery of the substrate. In such a case, as in the present invention, it is desirable that the heating device be divided into a plurality of zones, and temperatures in respective zones are controlled, respectively. For example, the heating device is divided into a zone facing a central portion of the substrate and a zone facing an outer peripheral portion of the substrate, and a temperature in the zone facing the outer peripheral portion of the substrate is caused to be higher than a temperature in the zone facing the central portion of the substrate for thereby making uniform a temperature of the substrate in its entirety.

According to an aspect of the present invention, there is provided an electroless plating apparatus comprising: a holding device for holding a substrate with a surface, to be plated, facing upwardly; a plating liquid holding mechanism for sealing a periphery of the surface, to be plated, of the substrate held by the holding device; an electroless plating treatment liquid supply device for supplying an electroless plating treatment liquid to the surface, to be plated, of the substrate sealed by the plating liquid holding mechanism to allow supplied electroless plating liquid to be stored on the substrate; a heating device provided in the vicinity of the substrate; and a lid member for covering the substrate to which the electroless plating treatment liquid has been supplied.

By placing the lid member over the substrate during an electroless plating treatment, evaporation of electroless plating treatment liquid and heat dissipation caused by generation of air current can be suppressed, and hence plating of the substrate can be more effectively performed. The lid member may be or may not be brought into contact with a liquid surface of the electroless plating treatment liquid.

According to a preferred aspect of the present invention, the electroless plating treatment liquid supply device is provided above a surface, to be plated, of a substrate, and has such a shape that the electroless plating treatment liquid supply device covers the surface, to be plated, of the substrate to which electroless plating treatment liquid is supplied, thus serving also as the lid member.

If the electroless plating treatment liquid supply device serves also as the lid member, the apparatus can be compact and reduced in cost.

According to a preferred aspect of the present invention, the electroless plating apparatus has a mechanism for sucking and recovering electroless plating treatment liquid remaining on a surface, to be plated, of a substrate.

Further, in order to achieve the second object, according to an aspect of the present invention, there is provided a plating apparatus comprising a plating treatment chamber including a holding device for holding a substrate with a surface, to be plated, facing upwardly; a plating treatment liquid holding mechanism for sealing a periphery of the surface, to be plated, of the substrate held by the holding device; and a device for supplying plating treatment liquid to the surface, to be plated, of the substrate sealed by the plating treatment liquid holding mechanism; wherein the plating treatment chamber constitutes a thermostatic chamber for maintaining an inner space of the plating treatment chamber at a temperature higher than an exterior temperature. With this arrangement, plating can be stably and reliably performed, and throughput can be improved.

According to a preferred aspect of the present invention, a plating treatment chamber is provided for applying plating treatment to a surface, to be plated, of a substrate by bringing a plating treatment liquid into contact with the surface, to be plated, of the substrate, and an inner space of the plating treatment chamber constitutes a thermostatic chamber for maintaining the inner space of the plating treatment chamber at a temperature substantially equal to a plating treatment temperature.

According to a preferred aspect of the present invention, a substrate to be carried into a plating treatment chamber and plating treatment liquid are preheated to a temperature substantially equal to a temperature in the plating treatment chamber. With this arrangement, optimum plating treatment reaction can be instantaneously obtained only by supplying a plating treatment liquid to the semiconductor substrate which has been carried into the plating treatment chamber, and throughput can be improved.

According to a preferred aspect of the present invention, a substrate storage chamber is provided adjacent to a plating treatment chamber for housing plural substrates to be treated and supplying them to the plating treatment chamber, and an inner space of the substrate storage chamber constitutes a substrate preheating area for maintaining an inner space of the substrate storage chamber at a temperature substantially equal to a temperature in the plating treatment chamber.

According to a preferred aspect of the present invention, a plating treatment liquid storage chamber is provided adjacent to a plating treatment chamber for storing a plating treatment liquid, and an inner space of the plating treatment liquid storage chamber constitutes a plating treatment liquid preheating area for maintaining an inner space of the plating treatment liquid storage chamber at a temperature substantially equal to a temperature in the plating treatment chamber.

According to the present invention, there is provided a substrate plating method comprising: using a holding device to hold a substrate with a surface, to be plated, facing upwardly; and supplying a plating liquid to the surface, to be plated, of the substrate and performing a plating treatment while a periphery of the surface, to be plated, of the substrate is sealed by a plating liquid holding mechanism; wherein the plating treatment is performed in a thermostatic chamber.

BRIEF DESCRIPTION OF THE DRAWINGS

FIG. 2 is a schematic view showing an electroless plating apparatus according to a first embodiment of the present invention;

DETAILED DESCRIPTION OF THE PREFERRED EMBODIMENTS

Embodiments of the present invention will be described below with reference to drawings. An electroless plating apparatus according to a first embodiment of the present invention is used for, for example, forming a seed layer or an interconnect comprising a copper layer by applying electroless copper plating onto a surface of a semiconductor substrate W. An example of this plating process will be described with reference to FIGS. 1A through 1C.

Figure 1A:
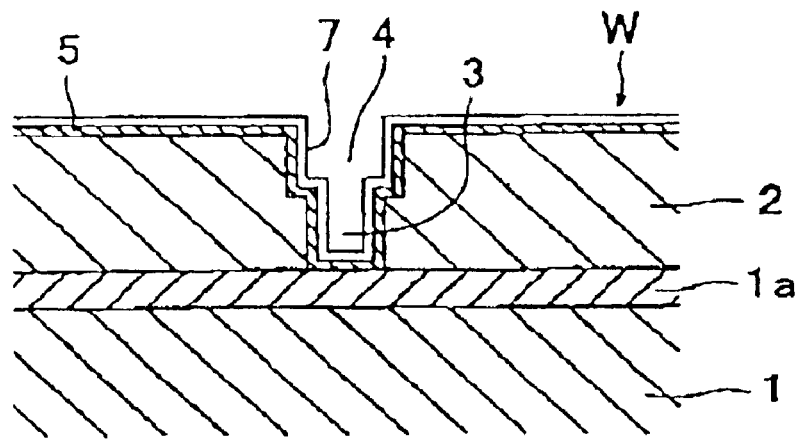
FIGS. 1A through 1C are views showing an example of a plating process.
Figure 1B:
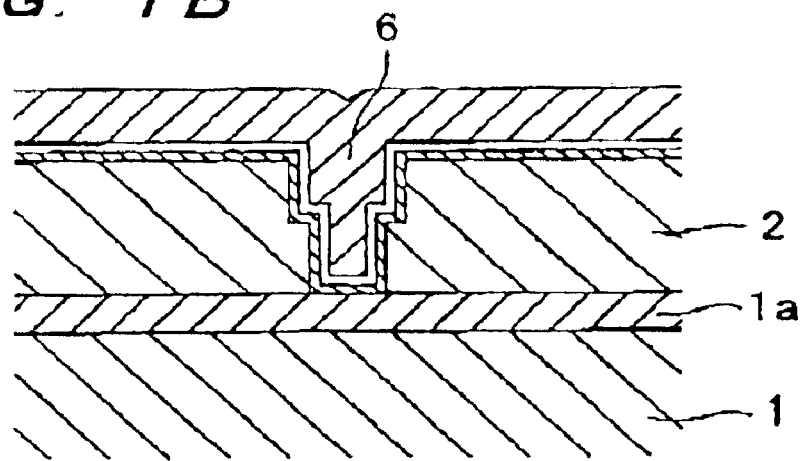

As shown in FIG. 1A, an insulating film 2 of $SiO_2$ is deposited on a conductive layer 1a of a substrate 1 on which semiconductor devices are formed, and a via hole 3 and a trench 4 for an interconnect are formed by performing lithography and etching technology. Thereafter, a barrier layer 5 of TiN or the like is formed on the insulating layer 2 and conductive layer 1*a*, and then a seed layer 7 is formed on the barrier layer 5 by electroless copper plating. In some cases, the seed layer 7 is preformed by sputtering or the like, and a reinforcing seed layer is formed by electroless copper plating on the seed layer 7 for reinforcing the seed layer. Further, as shown in FIG. 1B, copper plating is applied to a surface of the semiconductor substrate W to fill the via hole 3 and the trench 4 with copper and to deposit a copper layer 6 on the insulating film 2. Thereafter, the copper layer 6 on the insulating film 2 is removed by chemical mechanical polishing (CMP) to make a surface of the copper 6 filled into the via hole 3 and the trench 4 for the interconnect lie substantially flush with a surface of the insulating film 2, and then an interconnection-protective film 8 is formed on an exposed metal surface.

FIG. 2 is a schematic view showing an electroless plating apparatus according to an embodiment of the present invention. By using the electroless plating apparatus shown in FIG. 2, the seed layer 7 shown in FIG. 1A can be formed by copper plating, copper alloy plating, or cobalt alloy plating, the seed layer 7 can be reinforced by copper plating, the copper layer 6 shown in FIG. 1B can be formed by copper plating, and the interconnection-protective film 8 shown in FIG. 1C can be formed by cobalt alloy plating, nickel alloy plating, or copper alloy plating. A copper plating liquid used for copper plating comprises a copper sulfate liquid to which a reducing agent such as sodium hypophosphite or glyoxylic acid, a complexing agent, a pH buffer agent, a pH regulating agent, and the like are added. A nickel plating liquid used for the nickel alloy plating comprises nickel chloride or nickel sulfate to which sodium hypophosphite as a reducing agent in a case for Ni-P film, sodium borohydride as a reducing agent in a case for Ni-B film, and other agents, such as a complexing agent and a pH buffer agent are added.

As shown in FIG. 2, this electroless plating apparatus 10 comprises a holding apparatus (holding device ) 11 for holding a semiconductor substrate W to be plated on its upper surface, a dam member (plating liquid holding mechanism) 31 for contacting a peripheral edge portion of a surface to be plated (upper surface) of the semiconductor substrate W held by the holding apparatus 11 to seal the peripheral edge portion, and a shower head (electroless plating treatment liquid (scattering) supply device ) 41 for supplying a plating liquid (electroless plating treatment liquid) to the surface, to be plated, of the semiconductor substrate W having the peripheral edge portion sealed with the dam member 31. The electroless plating apparatus 10 further comprises a cleaning liquid supply apparatus (cleaning liquid supply device ) 51 disposed near an upper outer periphery of the holding apparatus 11 for supplying a cleaning liquid to the surface, to be plated, of the semiconductor substrate W, a recovery vessel 61 for recovering a cleaning liquid or the like (plating waste liquid) discharged, a plating liquid recovery nozzle 65 for sucking in and recovering plating liquid held on the semiconductor substrate W, and a motor (rotational drive device ) M for rotationally driving the holding apparatus 11. These respective members will be described below.

The holding apparatus 11 is adapted to be rotated by the motor M and is movable vertically by a non-illustrated raising and lowering apparatus (raising and lowering device ). The holding apparatus 11 has a substrate placing portion 13 on its upper surface for placing and holding the semiconductor substrate W.

Figure 3:
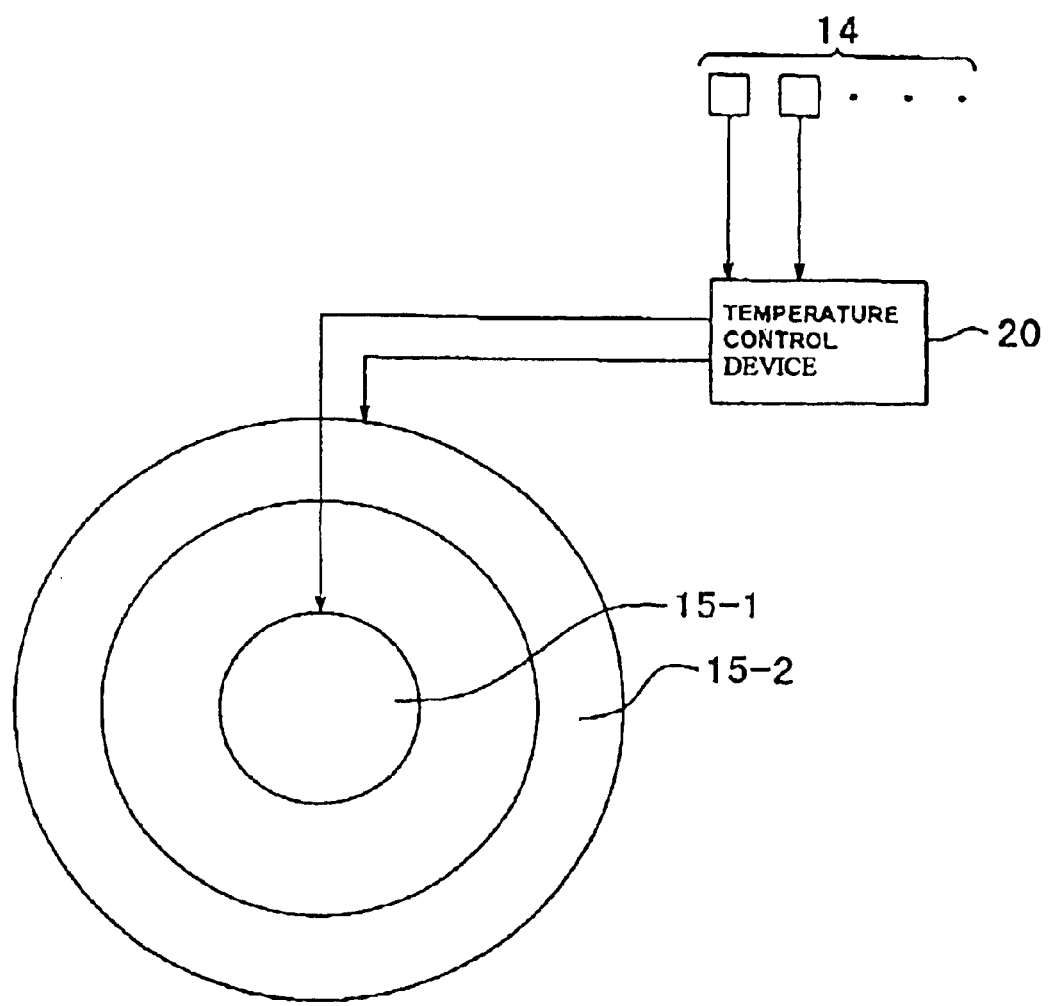
FIG. 3 is a plan view of a backside heater.

The substrate placing portion 13 is adapted to place and fix the semiconductor substrate W thereon, and has a uniform temperature forming section 17, at its portion where the semiconductor substrate W is placed, which comprises a circular recess having an inner diameter slightly smaller than a diameter of the semiconductor substrate W. Temperature sensors 14 are embedded respectively in predetermined positions of a central portion and a peripheral portion of the uniform temperature forming section 17. These temperature sensors 14 are composed of, for example, infrared ray sensors for detecting a temperature of a backside surface of the semiconductor substrate which faces these sensors. On the other hand, backside heaters (heating apparatus (heating device )) 15-1, 15-2 for heating a surface, to be plated, of the semiconductor substrate W from an underside thereof are provided below the uniform temperature forming section 17. As shown in FIG. 3, the backside heater 15-1 comprises a circular backside heater centrally disposed, and the backside heater 15-2 comprises a ring-like backside heater disposed so as to surround the backside heater 15-1. These backside heaters 15-1, 15-2 are composed of, for example, a rubber heater and are controlled at respective predetermined temperatures by a temperature control apparatus (temperature controlling device) 20 shown in FIG. 3. Temperature detection signals from respective temperature sensors 14 are inputted to the temperature control apparatus 20.

The dam member 31 is tubular, has a seal portion 33 provided in a lower portion thereof for sealing the outer peripheral edge of the semiconductor substrate W, and is installed so as not to move vertically from its illustrated position.

The shower head (electroless plating treatment liquid (scattering) supply device) 41 is of a structure having many nozzles provided at a front end for scattering supplied plating liquid in a shower form and supplying the liquid substantially uniformly to the surface, to be plated, of the semiconductor substrate W. Thus, it is desirable that the plating liquid to be supplied is heated to a temperature (for example, 50° C.) suitable for plating. Therefore, it is desirable for a piping extending from a plating liquid supplying source to the shower head (plating liquid supply device) 41 to use a material having a high heat retaining property. For example, the piping has a double-tube structure in which a plating liquid flows through a central passage and a heat insulating medium (warmth retention means) is filled into an outer passage defined between the tubes of the double-tube structure. The heat insulating medium comprises, for example, gas such as air or liquid such as water or warm water heated to a predetermined temperature (for example, 50° C.). When heated gas or liquid is filled into the outer passage, even if a temperature of the plating liquid is low in the plating liquid supply source, the plating liquid is heated in the piping, thus making it possible to increase a temperature of the plating liquid suitable for plating when the plating liquid reaches the shower head 41. On the other hand, the cleaning liquid supply apparatus 51 has a structure for ejecting a cleaning liquid from a nozzle 53.

The plating liquid recovery nozzle 65 is adapted to be movable upwardly and downwardly and is swingable, and a front end of the plating liquid recovery nozzle 65 is adapted to be lowered inwardly of the dam member 31 located on the upper peripheral edge portion of the semiconductor substrate W and suck in plating liquid on the semiconductor substrate W.

Next, peration of the electroless plating apparatus will be described. First, the holding apparatus 11 is lowered from its illustrated state to provide a gap of a predetermined dimension between the holding apparatus 11 and the dam member 31, and semiconductor substrate W is placed on and fixed to the substrate placing portion 13. At this time, the uniform temperature forming section 17 is closed. An 8 inch wafer, for example, is used as the semiconductor substrate W.

Then, the holding apparatus 11 is raised to bring its upper surface into contact with a lower surface of the dam member 31 as illustrated, and an outer periphery of the semiconductor substrate W is sealed with the seal portion 33 of the dam member 31. At this time, a surface of the semiconductor substrate W is in an open state.

Then, the semiconductor substrate W itself is heated through the uniform temperature forming section 17, comprising an air layer, by the backside heaters 15-1, 15-2 to render a temperature of the semiconductor substrate W, for example, 70° C. (maintained until termination of plating). Then, plating liquid heated, for example, to 50° C. is ejected from the shower head 41 to pour the plating liquid over substantially an entire surface of the semiconductor substrate W. Heating temperatures of the backside heaters 15-1, 15-2 are controlled by the temperature control apparatus 20 shown in FIG. 3 according to temperatures of respective portions of the semiconductor substrate detected by respective temperature sensors 14. For example, the semiconductor substrate W normally tends to be cooled more at its outer peripheral edge than at its central portion. In such a case, a heating temperature of the backside heater 15-2 is slightly higher than that of the backside heater 15-1 for thereby keeping respective portions of the semiconductor substrate at a uniformly warm temperature.

Since the surface of the semiconductor substrate W is surrounded by the dam member 31, all the poured plating liquid is held on the surface of the semiconductor substrate W. An amount of supplied plating liquid may be a small amount which will become 1 mm thick (about 30 ml) on the surface of the semiconductor substrate W. A depth of the plating liquid held on the surface to be plated may be 10 mm or less, and may be even 1 mm as in this embodiment. If a small amount of the supplied plating liquid is sufficient as in the present embodiment, a heating apparatus for heating the plating liquid may be of a small size. In this embodiment, a temperature of the semiconductor substrate W is raised to 70° C., and a temperature of the plating liquid is raised to 50° C. by heating. Thus, the surface, to be plated, of the semiconductor substrate W becomes, for example, 60° C., and hence a temperature optimal for a plating reaction in this embodiment can be achieved. If the semiconductor substrate W itself is adapted to be heated as described above, to raise a temperature of the plating liquid much electric power consumption is not required. This is preferred, because electric power consumption can be decreased, and a change in a property of the plating liquid can be prevented. Electric power consumption for heating the semiconductor substrate W itself may be small, and an amount of plating liquid held on the semiconductor substrate W may be also small. Thus, heat retention of the semiconductor substrate W by the backside heaters 15-1, 15-2 can be performed easily, a capacity of the backside heaters can be small, and the apparatus can be made compact. If a device for directly cooling the semiconductor substrate W itself is used, switching between heating and cooling may be performed during plating to change plating conditions. Since plating liquid held on the semiconductor substrate is in a small amount, temperature control can be performed with good sensitivity.

On the other hand, in the present embodiment, there is provided the uniform temperature forming section 17, having a gap (space) between the backside heaters 15-1, 15-2 and semiconductor substrate W for filling gas therein. Because the uniform temperature forming section 17 has a large heat capacity, even if surfaces of the backside heaters 15-1, 15-2 have non-uniform temperature distribution, respective portions of the uniform temperature forming section 17 become uniform in temperature, and thus a backside surface of the semiconductor substrate W can be heated to a uniform temperature with high accuracy. Although air is used as gas in this embodiment, various other kinds of gas such as inert gas may be used.

The semiconductor substrate W is instantaneously rotated by the motor M to perform uniform liquid wetting of the surface to be plated, and then plating of the surface to be plated is performed in such a state that the semiconductor substrate W is in a stationary state. Specifically, the semiconductor substrate W is rotated at 100 rpm (100 min$^{-1}$) or less for only 1 second to uniformly wet the surface, to be plated, of the semiconductor substrate W with the plating liquid. Then, the semiconductor substrate W is kept stationary, and electroless plating is performed for 1 minute. An instantaneous rotating time is at most 10 seconds or less.

After completion of the plating treatment, the front end of the plating liquid recovery nozzle 65 is lowered to an area near an inside of the dam member 31 on the peripheral edge portion of the semiconductor substrate W to suck in plating liquid. At this time, if the semiconductor substrate W is rotated at a rotational speed of, for example, at least 100 rpm (100 min$^{-1}$), plating liquid remaining on the semiconductor substrate W can be gathered at a portion of the dam member 31 on the peripheral edge portion of the semiconductor substrate W via centrifugal force, so that recovery of the plating liquid can be performed with good efficiency and a high recovery rate. The holding apparatus 11 is lowered to separate the semiconductor substrate W from the dam member 31. The semiconductor substrate W is started to be rotated, and a cleaning liquid (ultrapure water) is jetted at the plated surface of the semiconductor substrate W from the nozzle 53 of the cleaning liquid supply apparatus 51 to cool the plated surface and simultaneously perform dilution of plating liquid and cleaning of the semiconductor substrate W, thereby stopping an electroless plating reaction. At this time, the cleaning liquid jetted from the nozzle 53 may be supplied to the dam member 31 to perform cleaning of the damn member 31. Plating waste liquid at this time is recovered into the recovery vessel 61, and then discarded.

Plating liquid once used is not reused, but thrown away. As described above, since the amount of the plating liquid used in this apparatus can be made very small, compared with that in the prior art, an amount of plating liquid which is discarded is small, even without reuse. In some cases, the plating liquid recovery nozzle 65 may not be installed, and plating liquid which has been used may be recovered as a plating waste liquid into the recovery vessel 61, together with a cleaning liquid.

Then, the semiconductor substrate W is rotated at a high speed by the motor M for spin-drying, and then the semiconductor substrate W is removed from the holding apparatus 11.

Figure 4:
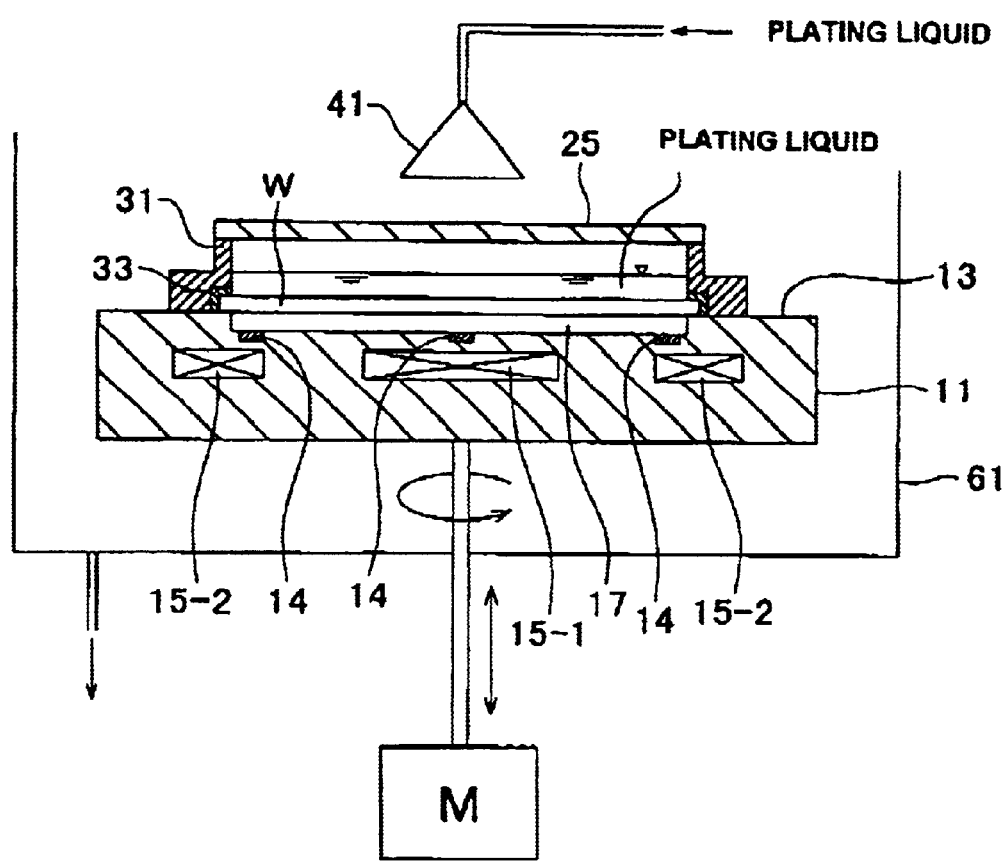
FIG. 4 is a schematic view showing an electroless plating apparatus according to another embodiment of the present invention.

FIG. 4 is a schematic view showing an electroless plating apparatus according to another embodiment of the present invention. The cleaning liquid supply apparatus 51 and the plating liquid recovery nozzle 65 shown in FIG. 2 are not shown in FIG. 4 for convenience of explanation. This embodiment is different from the embodiment shown in FIG. 2 only in that a lid member 25 for covering semiconductor substrate W is provided. The lid member 25 is adapted to be movable between a position where the lid member 25 covers an upper surface of dam member 31 and a position where the lid member 25 does not cover the upper surface of the dam member 31. The lid member 25 is normally located at a position where the lid member 25 does not cover the upper surface of the dam member 31, and after plating liquid is supplied onto the semiconductor substrate W by shower head 41, the lid member 25 moves to the position, shown in FIG. 4, where the lid member 25 covers the upper surface of the dam member 31.

By locating the lid member 25 over the semiconductor substrate W to which plating liquid has been supplied so as to cover the semiconductor substrate W, evaporation of the plating liquid and heat dissipation caused by generation of an air current can be suppressed, and hence temperature control during electroless plating can be easily performed with high accuracy. In this embodiment, although a space is defined between plating liquid on the semiconductor substrate W and the lid member 25, the plating liquid and the lid member 25 may contact each other (in order to prevent a temperature of the plating liquid from changing, though it is normally desirable for the lid member and the liquid to not contact each other).

Figure 5:
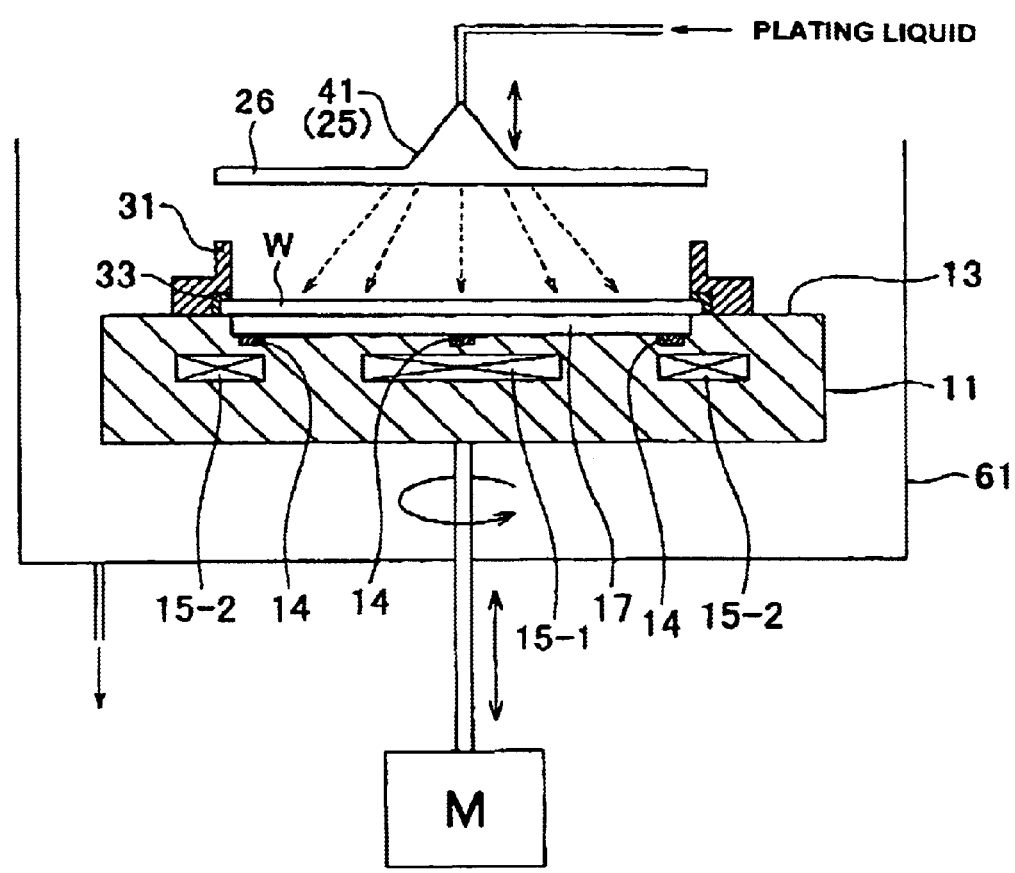
FIG. 5 is a schematic view showing an electroless plating apparatus according to another embodiment of the present invention.

FIG. 5 is a schematic view showing an electroless plating apparatus according to still other embodiment of the present invention. In FIG. 5 also, illustration of the cleaning liquid supply apparatus 51 and the plating liquid recovery nozzle 65 shown in FIG. 2 is omitted. This embodiment is different from the embodiment shown in FIG. 4 in that shower head 41 serves also as lid member 25, without providing the lid member as an independent and separate member. Specifically, the shower head 41 placed over a surface, to be plated, of a semiconductor substrate W is adapted to be movable vertically, and by providing a plate-like projecting portion 26 on an outer periphery of the shower head 41, the shower head 41 itself serves as the lid member 25 which is positioned over the semiconductor substrate W so as to cover the semiconductor substrate W. With this arrangement, because the lid member 25 is not required to be provided separately, the apparatus can be compact and can be manufactured at a low cost.

Figure 6:
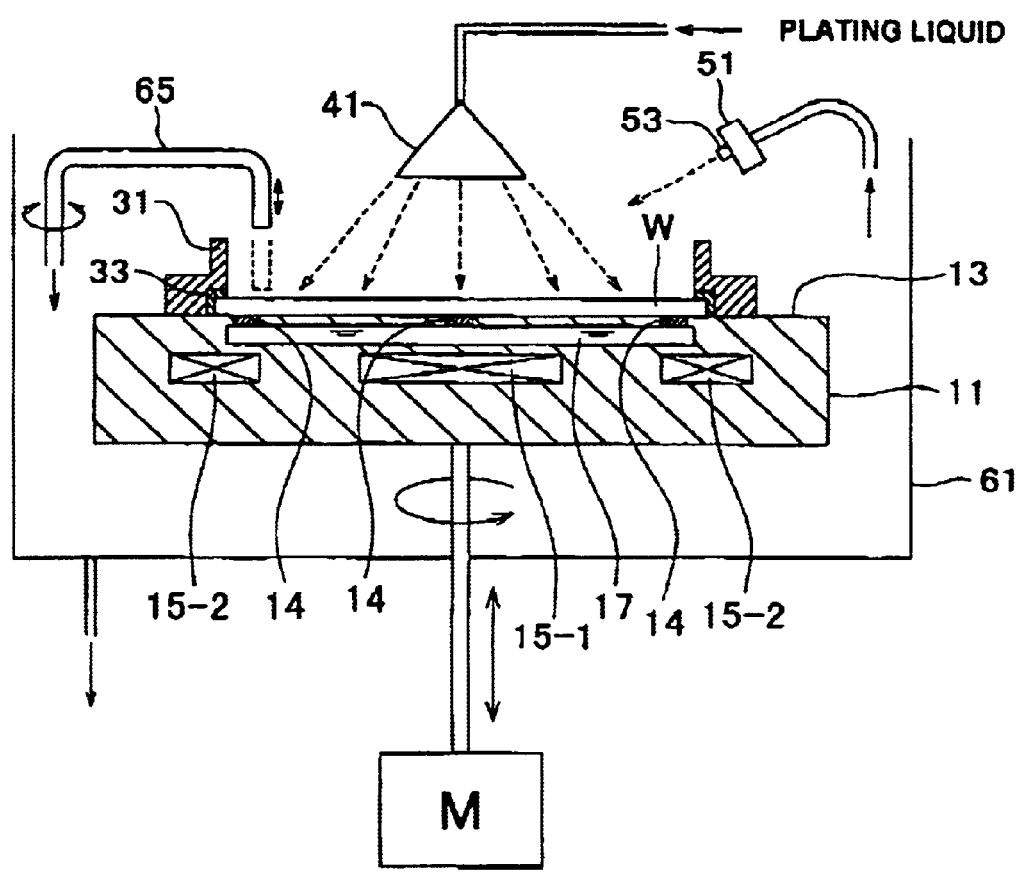
FIG. 6 is a schematic view showing an electroless plating apparatus according to another embodiment of the present invention.

FIG. 6 is a schematic view showing an electroless plating apparatus according to still another embodiment of the present invention. The embodiment shown in FIG. 6 is different from the embodiment shown in FIG. 2 in that a hollow uniform temperature forming section 17 is provided inside holding apparatus 11, instead of providing a recess-like uniform temperature forming section, and liquid (for example, water) is filled into the hollow uniform temperature forming section 17. With this arrangement also, since the uniform temperature forming section 17, comprising a clearance (space) for filling liquid having a large heat capacity therein, is formed between backside heaters 15-1, 15-2 and semiconductor substrate W, even if surfaces of the backside heaters have non-uniform temperature distribution, a temperature at respective portions in the uniform temperature forming section 17 can be uniform, and a backside surface of the semiconductor substrate W can be heated to a uniform temperature with high accuracy. Although liquid such as water is filled into the uniform temperature forming section 17 in this embodiment, gas such as air may be filled therein. By providing a piping and a pump for withdrawing liquid from the hollow uniform temperature forming section 17 to the an exterior, replacement of liquid or the like may be performed. In this case, a temperature of the liquid to be supplied is preferably raised to a predetermined temperature in advance.

Although embodiments of the present invention have been described, the present invention is not limited to the above embodiments, and various modifications may be made within the scope of the claims and the scope of the technical ideas described in the specification and drawings. For example, the electroless plating apparatus according to the present invention is not limited to formation of a seed layer and a copper layer for interconnects, and can be used for formation of an interconnection-protective film and a diffusion-preventive film.

Further, the electroless plating apparatus according to the present invention can also be used in a pretreatment step and a catalyst treatment step for electroless plating. That is, in the above embodiments, for example, electroless plating was performed by supplying an electroless plating liquid from shower head 41 to a surface, to be plated, of a semiconductor substrate W. However, other electroless plating treatment liquid for use in a pretreatment step or a catalyst treatment step, for electroless plating, may be supplied from the shower head 41 before a step of supplying an electroless plating liquid. Thus, these other treatment steps can also be performed by this electroless plating apparatus, together with an electroless plating step.

In the above embodiments, plating is carried out in such a state that plating liquid is held on a surface to be plated, and a substrate is kept stationary. However, the substrate may be rotated slowly to such a degree that uneven plating does not occur.

Furthermore, the shower head is not restrictive, if the plating liquid can be supplied in a scattered manner to the surface to be plated. For example, there may be provided a nozzle which supplies the plating liquid while performing a swinging motion or a translational motion.

In the above embodiments, cleaning is performed during a cleaning step, after plating, by supplying cleaning liquid while holding apparatus 11 is separated from dam member 31. However, cleaning may be performed by supplying cleaning liquid while the holding apparatus 11 is not separated from the dam member 31, and by causing the cleaning liquid to overflow from an upper edge of the dam member 31. When plating liquid remaining is diluted by supplying the cleaning liquid, a liquid temperature is simultaneously lowered, whereupon an electroless plating reaction comes to an end. Incidentally, the holding apparatus 11 and the dam member 31 may be separated by raising the dam member 31, instead of lowering the holding apparatus 11.

During heating of the semiconductor substrate W by the backside heaters 15-1, 15-2 (especially during a period from start of heating to contact of plating liquid with a surface of the substrate), it is desirable to blow an inert gas such as an argon (Ar) gas onto the surface, to be plated, of the semiconductor substrate W in order to prevent oxidation. If a seed layer formed by sputtering or the like is exposed at the surface of the semiconductor substrate W, heating of the seed layer may result in oxidation of a surface of the seed layer. Thus, blowing of such inert gas is particularly effective when it is attempted to prevent oxidation of the seed layer and form a plated layer of more uniform film thickness on the seed layer.

In the above embodiments, the backside heaters 15-1, 15-2 are used as a heating apparatus for semiconductor substrate W, but a heater may be provided at other positions close to the substrate. Moreover, in addition to the use of this heater, a temperature of surroundings for performing electroless plating may be made substantially equal to an electroless plating treatment temperature (a temperature suitable for plating of the surface, to be plated, which is a reaction surface), whereby heat dissipation can be prevented to maintain a treatment temperature constant. In this case, a heated gas may be supplied to surroundings of the substrate, for example.

In the above embodiments, a step of instantaneously rotating a substrate is used as a step of bringing electroless plating treatment liquid supplied onto a surface, to be plated, of the substrate into contact with the surface to be plated. Other steps may include spreading the electroless plating treatment liquid all over the surface to be plated, by moving the substrate, or moving the supplied electroless plating treatment liquid. That is, the step of moving the substrate is, for example, to vibrate or swing (shakingly move) the substrate to which the electroless plating treatment liquid is supplied. The step of moving the supplied electroless plating treatment liquid is, for example, to rake the supplied electroless plating treatment liquid by using a raking member, or to blow gas onto a surface of the liquid.

In the above embodiments, electroless plating on a semiconductor substrate is illustrated. However, the above electroless plating apparatus are applicable to many substrates other than a semiconductor substrate.

According to the present invention, as described above, the following excellent effects can be obtained:

① Electroless plating treatment liquid is stored and held on a surface, to be plated, of a substrate for a predetermined time to treat the surface to be plated. Thus, treatment of the surface to be plated can be performed using a small amount of the electroless plating treatment liquid, so that a cost reduction can be achieved. Further, a pump of a small size can be used as a pump for supplying electroless plating treatment liquid, the electroless plating apparatus can be made compact, and a cost for a clean room housing the apparatus can be reduced. Since a small amount of electroless plating treatment liquid is used, heating and warmth retention of the electroless plating treatment liquid can be easily and promptly performed. Furthermore, there is no need to constantly heat a large amount of electroless plating treatment liquid, and hence deterioration of the electroless plating treatment liquid is not promoted.

② Since an amount of electroless plating treatment liquid used may be small, discarding this liquid as it is does not lead to a cost increase. A fresh electroless plating treatment liquid can always be used, and composition of the treatment liquid can be made constant. By-products generated when the liquid is used in a circulated manner are not deposited in the system, and stable treatment such as plating can be carried out easily. A liquid analyzer or a liquid adjustor for plating liquid becomes unnecessary, and a decrease in equipment cost and a decrease in clean room cost can be achieved. Since a large amount of the electroless plating treatment liquid is not used in a circulated manner, particles are difficult to be generated from constituent members of the apparatus, thus obviating a need for a filter.

③ Because treatment is performed in such a state that electroless plating treatment liquid is held on a surface, to be plated, of a substrate treatment conditions for respective portions of the surface to be plated can be equalized, in comparison with a case in which treatment is performed in such a state that electroless plating treatment liquid is dripped onto a surface to be plated. Consequently, in-plane uniformity of a thickness of a resulting plated film can be achieved. Particularly, when treatment is performed in such a state that a substrate is in a stationary state, heat dissipation due to peripheral speed of the substrate does not take place, a reaction temperature can be uniformized without a fall in the temperature, and a stable process can be obtained, in comparison with a case in which treatment is performed in such a state that a substrate is rotated.

④ Because a gap (uniform temperature forming section) is provided between a heating apparatus and a substrate, even if a heating apparatus having non-uniform surface temperature distribution is used, an entirety of the gap (uniform temperature forming section) can have the same temperature, and a heating temperature at respective portions of the substrate can be made uniform.

⑤ Because a heating apparatus is used which has a plurality of divided zones and temperature control can be performed in each of the zones, temperature of an entire substrate can be made uniform.

⑥ Because a lid member is provided so as to cover a substrate to which electroless plating treatment liquid is supplied, evaporation of the electroless plating treatment liquid and heat dissipation caused by generation of an air current can be suppressed, and hence plating of the substrate can be more effectively performed. Specifically, if an electroless plating treatment liquid supply apparatus serves also as the lid member, the apparatus can be made compact and reduced in cost.

⑦ A pretreatment liquid, a catalytic treatment liquid, an electroless plating liquid or the like can be used as an electroless plating treatment liquid while switching any of these liquids, and hence a series of electroless plating steps can be carried out in a single cell, and the apparatus can be made compact.

Figure 7:
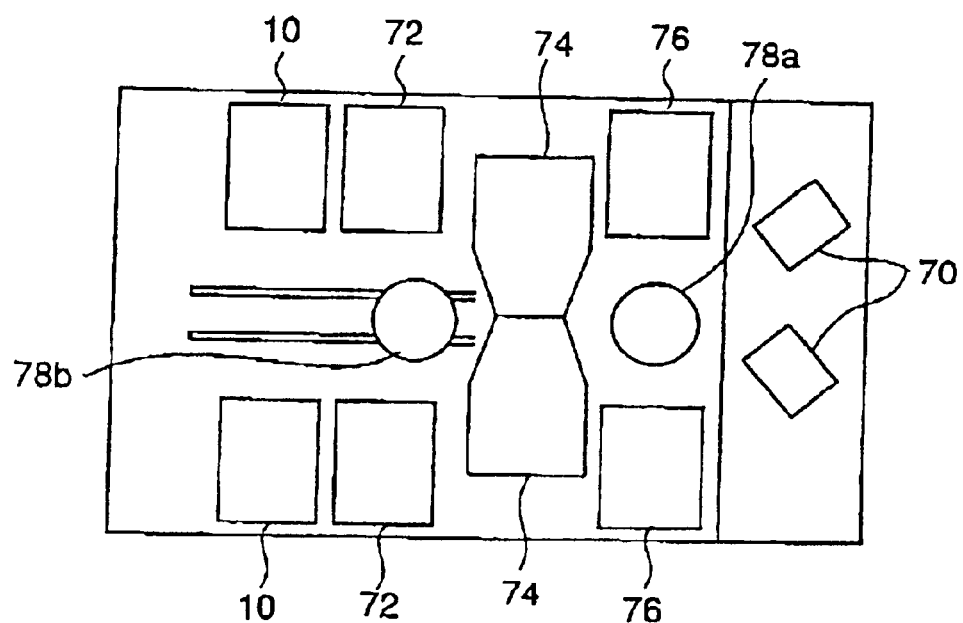
FIG. 7 is a plan view showing an example of a plating treatment apparatus having the electroless plating apparatus shown in FIG. 2.

FIG. 7 shows an entire structure of a plating treatment apparatus in which a series of plating treatments is performed by electroless plating apparatus 10 shown in FIGS. 1 through 6. This plating treatment apparatus comprises: a pair of electroless plating apparatuses 10; load and unload sections 70; plating pretreatment apparatuses 72 for performing plating pretreatment such as a catalyst treatment for imparting, for example, Pd catalyst, or an oxide film removal treatment for removing an oxide film formed on a surface of an exposed interconnect; temporary storage sections 74 capable of performing rough cleaning; and post-cleaning apparatuses 76. The plating treatment apparatus further comprises a first transfer apparatus 78a for transferring a substrate between the load and unload sections 70, the post-cleaning apparatuses 76, and the temporary storage sections 74; and a second transfer apparatus 78b for transferring the substrate between the plating pretreatment apparatuses 72 and the temporary storage sections 74.

Next a series of plating processes performed by the plating treatment apparatus having the above structure will be described. First, a semiconductor substrate held by load and unload section 70 is removed by the first transfer apparatus 78a and placed on temporary storage section 74. The second transfer apparatus 78b transfers the semiconductor substrate to plating pretreatment apparatus 72 in which a plating pretreatment such as a catalyst imparting treatment of a catalyst such as $PdCl_2$ liquid, or an oxide film removal treatment for removing an oxide film formed on a surface of an exposed interconnect, is performed, and then the semiconductor substrate is rinsed.

Then, the second transfer apparatus 78b transfers the substrate to electroless plating apparatus 10 in which an electroless plating treatment is performed using a predetermined reducing agent and a predetermined plating liquid. Next, the semiconductor substrate, which has been plated, is removed from the electroless plating apparatus 10 and is transferred to temporary storage section 74 by the second transfer apparatus 78b. Rough cleaning of the substrate is performed in the temporary storage section 74. Then, the first transfer apparatus 78a transfers the substrate to post-cleaning apparatus 76 where finish-cleaning of the substrate is performed by a pencil-type sponge and spin-drying of the substrate is also performed, and then the first transfer apparatus 78a returns the substrate to the load and unload section 70. Thereafter, the substrate is transported to a plating apparatus or an oxide film forming apparatus.

Figure 1C:
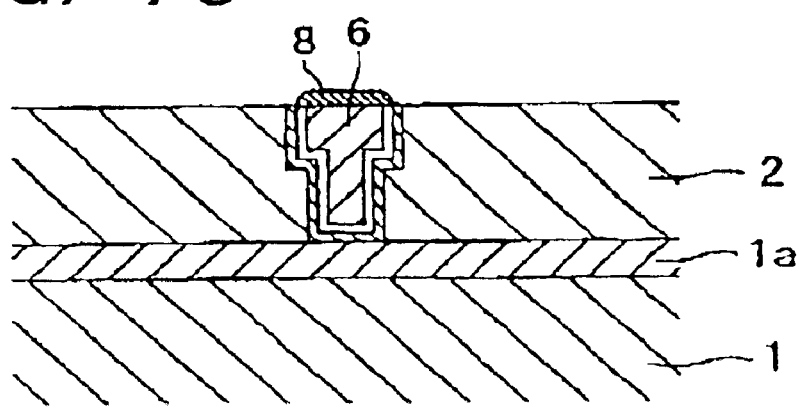
Figure 8:
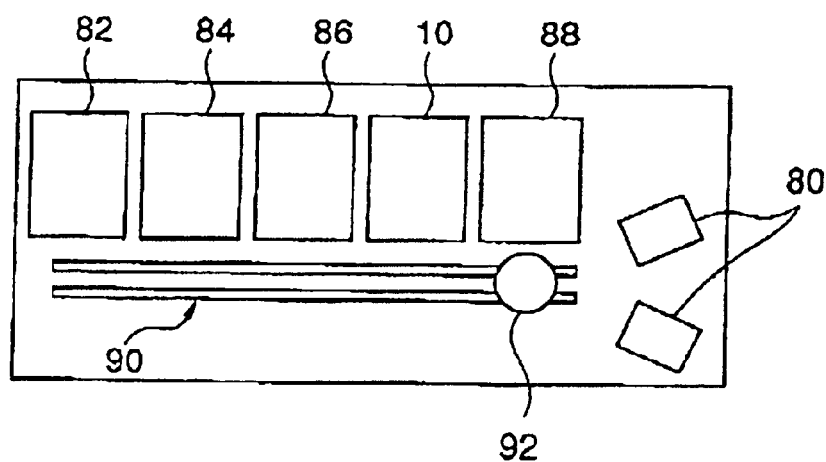
FIG. 8 is a plan view showing another example of a plating treatment apparatus having the electroless plating apparatus shown in FIG. 2.

FIG. 8 shows an entire structure of a plating treatment apparatus for performing a series of plating treatments (cap plating treatment) for forming the protective film 8 as shown in FIGS. 1A through 1C. This plating treatment apparatus comprises load and unload sections 80, a pretreatment section 82, a Pd depositing section 84, a plating pretreatment section 86, an electroless plating apparatus 10, and a cleaning and drying treatment section 88. The plating treatment apparatus further comprises a transfer apparatus 92 which is movable freely along a transfer path 90 and transfers a substrate between these sections.

Next, a series of plating processes (cap plating treatment) by the plating treatment apparatus having the above structure will be described. First, a substrate held by load and unload section 80 is removed by the transfer apparatus 92 and transferred to the pretreatment section 82 where pretreatment such as another cleaning of a surface of the substrate is performed. Thereafter, by depositing Pd on a surface of copper layer 6 (see FIG. 1A) in the Pd depositing section 84, an exposed surface of the copper layer 6 is activated, and then a plating pretreatment such as a neutralization treatment is performed in the plating pretreatment section 86. Next, the substrate is transferred to the electroless plating apparatus 10 where selective electroless plating is applied, for example, Co—W—P to a surface of the activated copper layer 6, and hence an exposed surface of the copper layer 6 is protected by a Co—W—P film (protective film) 8 as shown in FIG. 1C. This electroless plating liquid comprises, for example, cobalt salt and tungsten salt to which a reducing agent, a complexing agent, a pH buffer agent, and a pH regulating agent are added.

After polishing, electroless Ni—B plating may be applied to form a protective film (plated film) 8 comprising an Ni—B alloy film selectively on a surface, of interconnect 6, exposed to an exterior for thereby protecting the interconnect. A film thickness of the protective film is in the range of from 0.1 to 500 nm, preferably 1 to 200 nm, more preferably 10 to about 100 nm.

The electroless Ni—B plating liquid for forming the protective film 8 contains, for example, nickel ions, a complexing agent of nickel ions, and alkylamine borane or borohydride as a reducing agent for nickel ions, and a pH of the electroless Ni—B plating liquid is adjusted to be within the range of from 5 to 12 by use of TMAH (tetramethylammonium hydroxide).

Next, after the cap plating treatment, the substrate is transferred to the cleaning and drying treatment section 88 where a cleaning and drying treatment of the substrate is performed. The substrate which has been cleaned and dried is returned to a cassette in the load and unload section 80 by the transfer apparatus 92.

In the above example, as the cap plating treatment, before the electroless Co—W—P plating treatment is applied, the exposed surface of the copper layer 6 which has been activated by depositing Pd is covered selectively with the Co—W—P film. However, the cap plating treatment is not limited to the above example.

Figure 9:
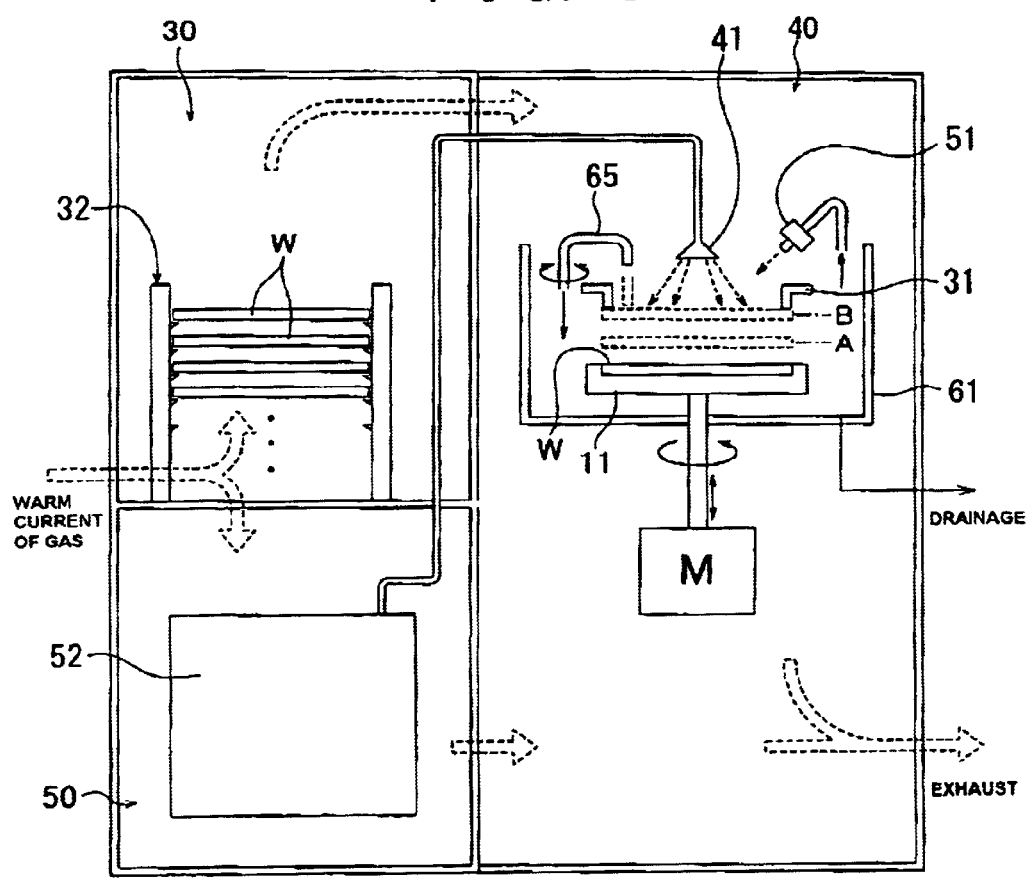
FIG. 9 is a schematic view showing a plating apparatus according to a second embodiment of the present invention.
Figure 10:
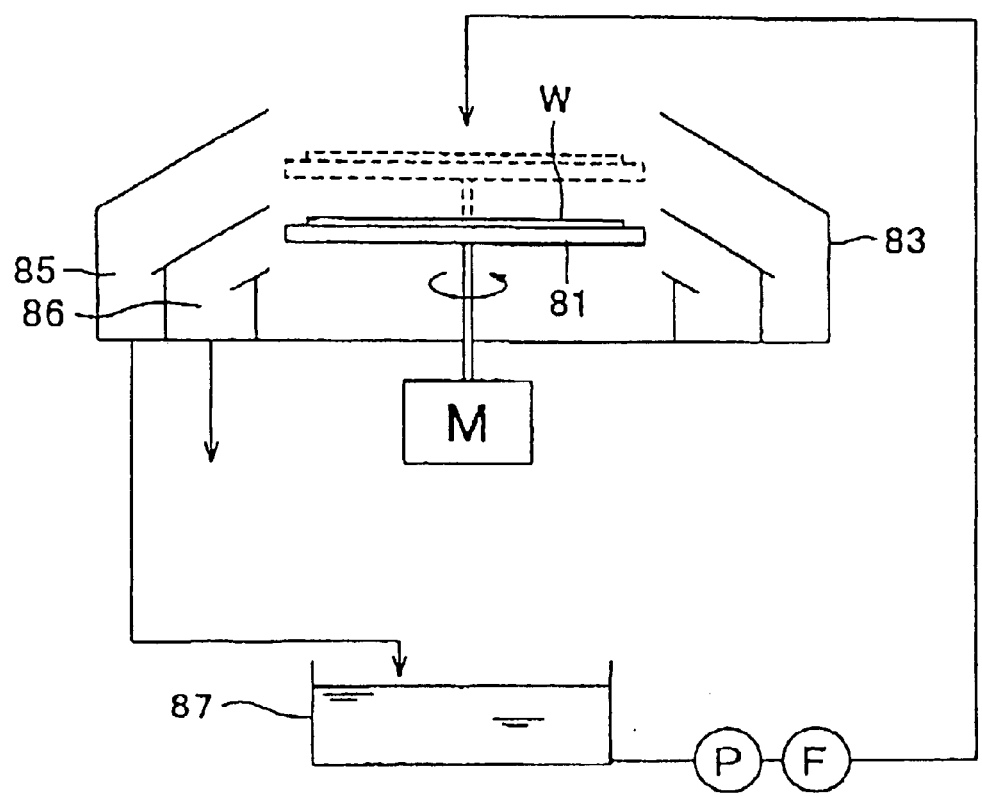
FIG. 10 is a schematic view showing a conventional electroless plating apparatus.
Figure 11:
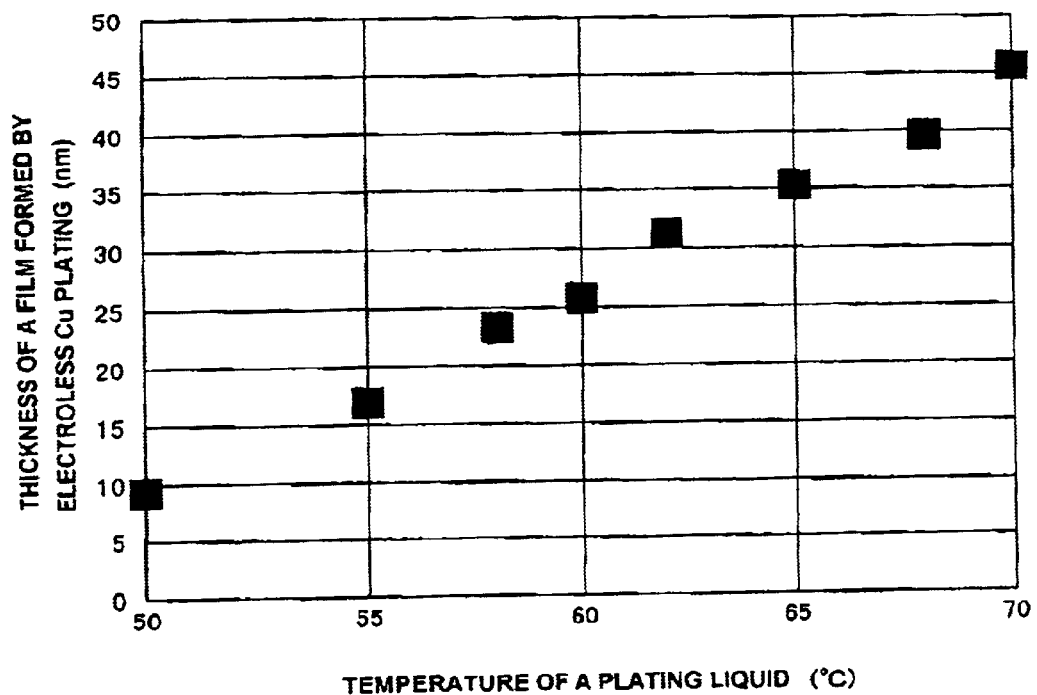
FIG. 11 is a view showing measured results of relationships between temperature of a plating liquid and thickness of plated film formed by electorless copper plating.

FIG. 9 is a schematic view showing a second embodiment of the plating apparatus (electroless plating apparatus) according to the present invention. By using the electroless plating apparatus shown in FIG. 9, seed layer 7 shown in FIG. 1A can be formed by copper plating, copper alloy plating, or cobalt alloy plating, the seed layer can be reinforced by copper plating, copper layer 6 shown in FIG. 1B can be formed by copper plating, and interconnection-protective film 8 shown in FIG. 1C can be formed by cobalt alloy plating, nickel alloy plating, or copper alloy plating. A copper plating liquid used for copper plating comprises a copper sulfate liquid to which a reducing agent such as sodium hypophosphite or glyoxylic acid, a complexing agent, a pH buffer agent, a pH regulating agent, and the like are added. A nickel plating liquid used in nickel alloy plating comprises nickel chloride or nickel sulfate to which sodium hypophosphite as a reducing agent in a case for Ni—P film, sodium borohydride as a reducing agent in a case for Ni—B film, and other agents, such as a complexing agent and a pH buffer agent are added.

As shown in FIG. 9, the electroless plating apparatus comprises a plating treatment chamber 40 for performing electroless plating treatment, a substrate storage chamber 30 for storing substrates to be treated, and a plating treatment liquid storage chamber 50 for storing a plating liquid and other plating treatment liquids, and these chambers are integrally combined.

The plating treatment chamber 40 comprises a holding apparatus 11 for holding a semiconductor substrate W to be plated on its upper surface, a dam member (plating treatment liquid holding mechanism) 31 for contacting a peripheral edge portion of a surface, to be plated (upper surface), of the semiconductor substrate W held by the holding apparatus 11 to seal the peripheral edge portion, and a shower head (plating treatment liquid supply device) 41 for supplying a plating liquid to the surface, to be plated, of the semiconductor substrate W having the peripheral edge portion sealed with the dam member 31. The plating treatment chamber 40 further comprises a cleaning liquid supply apparatus 51 disposed near an upper outer periphery of the holding apparatus 11 for supplying a cleaning liquid to the surface, to be plated, of the semiconductor substrate W, a recovery vessel 61 for recovering a discharged cleaning liquid or the like (plating waste liquid), a plating liquid recovery nozzle 65 for sucking in and recovering plating liquid held on the semiconductor substrate W, and a motor M for rotationally driving the holding apparatus 11.

The holding apparatus 11 holds the semiconductor substrate W by having the semiconductor substrate W placed on the upper surface of the holding apparatus 11. The holding apparatus 11 has a vacuum attraction mechanism (not shown) for holding the semiconductor substrate W under vacuum. The holding apparatus 11 is rotated by the motor M and is vertically movable by a non-illustrated raising and lowering apparatus (raising and lowering device). A position shown by solid lines in FIG. 9 is a position where the semiconductor substrate W is attached or detached, position A, located above the above-mentioned position, is a position where the semiconductor substrate W is cleaned, and position B, located above position A, is a position where the semiconductor substrate W is brought into contact with the dam member 31 and is plated.

The dam member 31 is tubular, has a seal portion provided at a lower portion thereof for sealing the outer peripheral edge of the semiconductor substrate W, and is installed so as not to move vertically from its illustrated position. The shower head (plating treatment liquid supply device) 41 is of a structure having many nozzles provided at a front end for scattering supplied plating liquid in a shower form and supplying the liquid substantially uniformly to the surface, to be plated, of the semiconductor substrate W. The cleaning liquid supply apparatus 51 has a structure for ejecting a cleaning liquid from a nozzle.

The plating liquid recovery nozzle 65 is adapted to be movable upwardly and downwardly and is swingable, and a front end of the plating liquid recovery nozzle 65 is adapted to be lowered inwardly of the dam member 31 located on the upper peripheral edge portion of the semiconductor substrate W to suck in plating liquid on the semiconductor substrate W.

Further, the substrate storage chamber 30 has a substrate holding apparatus (substrate holding device) 32 therein, and allows the substrate holding apparatus 32 to hold a plurality of semiconductor substrates W vertically arranged at a predetermined interval. The substrate holding apparatus 32 has such a structure that the substrate holding apparatus 32 holds the semiconductor substrates W, and lifts and lowers the semiconductor substrates W in an elevator manner, and when a semiconductor substrate W held by a substrate transfer mechanism (not shown) at an upper portion of the substrate holding apparatus is transferred to the holding apparatus 11, a subsequent semiconductor substrate W is raised to a transfer position.

Further, the plating treatment liquid storage chamber 50 has a plating treatment liquid storage unit 52 therein, and a plating liquid and other plating treatment liquids are stored respectively in the plating treatment liquid storage unit 52, and supplied to the shower head 41, as required.

The plating treatment chamber 40 constitutes a thermostatic chamber in which gas (inert gas, for example, argon gas or the like is preferable) therein can always be kept at a temperature equal to a temperature (plating treatment temperature, for example, 60° C.) optimum for electroless plating. With this arrangement, not only an atmosphere in the plating treatment chamber 40, but also various members such as the holding apparatus 11 can be kept warm and maintained at a temperature equal to a plating treatment temperature.

Furthermore, in this embodiment, both the substrate storage chamber 30 and the plating treatment liquid storage chamber 50 also constitute a preheating area (thermostatic chamber) in which gas, in the respective entire chambers, can be kept at a temperature equal to a temperature (for example, 60° C.) optimum for an electroless plating treatment, whereby a number of stored semiconductor substrates and a plating liquid or the like are preheated and maintained at a temperature equal to a plating treatment temperature.

In order to keep the plating treatment chamber 40, the substrate storage chamber 30 and the plating treatment liquid storage chamber 50 warm at the same temperature, gas (warm current of gas) such as inert gas heated to, for example, a temperature equal to a plating treatment temperature, is introduced from an exterior into the substrate storage chamber 30 as shown by an arrow represented by dotted lines in FIG. 9, and the gas is circulated between the plating treatment chamber 40 and the plating treatment liquid storage chamber 50, and then discharged from the plating treatment chamber 40. Temperature, humidity, and an amount of gas to be introduced are controlled by, for example, a temperature sensor and a humidity sensor installed in the plating treatment chamber 40 so that temperature and humidity in the plating treatment chamber 40 becomes optimum. As an apparatus for raising a temperature in the chambers 30, 40 and 50 to a predetermined value and maintaining such temperature at this value, a heater or a lamp or the like may be used instead of a warm current of gas. In short, any heating apparatus (heating device) for raising a temperature in the chambers 30, 40 and 50 to a predetermined value and maintaining such temperature at this valve may be used.

Next, operations of the plating apparatus will be described below. First, by keeping the plating treatment chamber 40, the substrate storage chamber 30 and the plating treatment liquid storage chamber 50 warm at the same temperature as described above, respective members therein are also kept warm at the same temperature. Then, a semiconductor substrate W held in the substrate holding apparatus 32 and placed at a highest position therein is transferred to the holding apparatus 11 by a substrate transfer mechanism (not shown), and then the holding apparatus 11 is raised to position B to bring an outer periphery of the semiconductor substrate W into contact with a lower surface of the dam member 31, and the outer periphery of the semiconductor substrate W is sealed with the dam member 31.

Next, plating liquid is ejected from the shower head 41 to pour the plating liquid over a surface of the semiconductor substrate W. Since the surface of the semiconductor substrate W is surrounded by the dam member 31, all the poured plating liquid is held on the surface of the semiconductor substrate W and electroless plating is performed. In the present invention, a temperature of the semiconductor substrate W and the plating liquid is raised to a plating treatment temperature (for example, 60° C.) in advance, and an atmosphere inside the plating treatment chamber 40 and respective members, such as the holding apparatus 11, are heated to and maintained at substantially the same temperature as above. Therefore, the semiconductor substrate W is not required to be heated, and optimum plating of the semiconductor substrate W is started only by supplying plating liquid onto the semiconductor substrate W.

After completion of a plating treatment, a front end of the plating liquid recovery nozzle 65 is lowered to a position near the surface of the semiconductor substrate W to suck in the plating liquid. The holding apparatus 11 is lowered to separate the semiconductor substrate W from the dam member 31 (position A). The semiconductor substrate W is started to be rotated, and cleaning liquid (ultrapure water) is jetted at a plated surface of the semiconductor substrate W from the cleaning liquid supply apparatus 51 to cool the plated surface, and simultaneously perform dilution of plating liquid and cleaning of the semiconductor substrate W, thereby stopping an electroless plating reaction. Plating waste liquid at this time is recovered into the recovery vessel 61 and discarded.

Plating liquid once used is not reused, but thrown away because an amount of the plating liquid used in this embodiment can be made very small, compared with that in the prior art.

Then, the semiconductor substrate W is rotated at a high speed by the motor M for spin-drying, and then the holding apparatus 11 is lowered to the position shown by the solid lines and the semiconductor substrate W is removed from the holding apparatus 11 to an exterior.

Although the embodiments of the present invention have been described, the present invention is not limited to the above embodiments and may be modified within the scope of claims and the scope of technical ideas described in the specification and drawings. Further, even if any shape, structure and material are not described directly in the specification and drawings, if they have the same function and effect as the present invention, then they are encompassed within the scope of the technical ideas of the present invention. For example, the plating apparatus according to the present invention is used not only for forming a seed layer or a copper layer for an interconnect, but also for forming an interconnection-protective film and a diffusion-preventive film. Further, the plating apparatus according to the present invention can be used for a pretreatment process of electroless plating, and also for a catalyst treatment process. Specifically, instead of electroless plating liquid, by using other plating treatment liquids used for the pretreatment process and the catalyst treatment process, these treatment processes can be performed by this electroless plating apparatus. Further, structure of a mechanism for performing electroless plating inside the plating treatment chamber 40, structure of a mechanism for housing a plurality of semiconductor substrates W inside the substrate storage chamber 30, and structure of a mechanism for storing various kinds of plating treatment liquids inside the plating treatment liquid storage chamber 50 may be modified in various ways.

Further, in the above embodiments, examples in which electroless plating is applied to semiconductor substrate W are described. However, the present invention is applicable to electroless plating for various substrates other than semiconductor substrates.

Furthermore, the present invention may be applied to an electroplating apparatus. A temperature of a plating treatment is 20° C. in a case of chromium electroplating, which is a kind of the electroplating, 20° C. in a case of Sn electroplating, and 5 to 20° C. in a case of Sn—Pd solder bump plating. A temperature of a plating treatment is 60 to 90° C. in a case of electroless Ni plating. Therefore, it goes without saying that a temperature inside the plating treatment chamber is changed variously corresponding to a type of plating being performed.

In an above embodiment, a temperature in the plating treatment chamber is kept at a temperature substantially equal to a temperature optimum for a plating treatment. However, in a case where a plating treatment temperature is higher than an exterior temperature (there are many cases of such with regard to elecroeless plating), only by keeping a temperature in the plating treatment chamber at a temperature higher than an exterior temperature, can a preferable electroless plating be performed.

As described above in detail, according to the present invention, because a plating treatment chamber constitutes a thermostatic chamber for maintaining temperature therein at a temperature substantially equal to a plating treatment temperature (or temperature higher than an exterior temperature), a surface of a plating reaction can be accurately kept warm at a predetermined temperature all during the plating reaction of the substrate, and hence plating can be stably and reliably performed. Further, by constructing the apparatus such that a substrate to be carried into the plating treatment chamber, and the plating treatment liquid are preheated to a temperature substantially equal to a temperature in the plating treatment chamber in advance, optimum plating treatment reaction can be instantaneously obtained only by supplying a plating treatment liquid to the substrate which has been carried in the plating treatment chamber, and throughput can be improved.

What is claimed is:

1. An electroless plating apparatus comprising:
a holding device for holding a substrate with a surface, to be plated, facing upwardly;
a plating liquid holding mechanism for sealing a periphery of the surface, to be plated, of the substrate while the substrate is held by said holding device;
an electroless plating treatment liquid supply device for supplying an electroless plating liquid to the surface, to be plated, of the substrate while being sealed by said plating liquid holding mechanism to allow supplied electroless plating liquid to be retained on the substrate;
a heating device provided in the vicinity of the substrate when the substrate is held by said holding device for heating the substrate in its entirety; and
a temperature control device for controlling a temperature of said heating device,
wherein said heating device has a plurality of divided zones and temperatures in respective zones are to be controlled, respectively, by said temperature control device.

2. The electroless plating apparatus according to claim 1, further comprising a mechanism for sucking and recovering electroless plating treatment liquid from the surface, to be plated, of the substrate.

3. An electroless plating apparatus comprising:
a holding device for holding a substrate with a surface, to be plated, facing upwardly;
a plating liquid holding mechanism for sealing a periphery of the surface, to be plated, of the substrate while the substrate is held by said holding device;
an electroless plating treatment liquid supply device for supplying an electroless plating treatment liquid to the surface, to be plated, of the substrate while being sealed by said plating liquid holding mechanism to allow supplied electroless plating treatment liquid to be retained on the substrate;
a heating device provided in the vicinity of the substrate when the substrate is held by said holding device; and
a lid member for covering the substrate after the electroless plating treatment liquid has been supplied to the surface of the substrate.

4. The electroless plating apparatus according to claim 3, further comprising a mechanism for sucking and recovering electroless plating treatment liquid from the surface, to be plated, of the substrate.

5. An electroless plating apparatus comprising:
a holding device for holding a substrate with a surface, to be plated, facing upwardly;
a plating liquid holding mechanism for sealing a periphery of the surface, to be plated, of the substrate while the substrate is held by said holding device;
an electroless plating treatment liquid supply device for supplying an electroless plating treatment liquid to the surface, to be plated, of the substrate while being sealed by said plating liquid holding mechanism to allow supplied electroless plating treatment liquid to be retained on the substrate; and
a heating device provided in the vicinity of the substrate when the substrate is held by said holding device;
wherein said electroless plating treatment liquid supply device is provided above the surface, to be plated, of the substrate, and has such a shape that said electroless plating treatment liquid supply device covers the surface, to be plated, of the substrate to which the electroless plating treatment liquid has been supplied when the substrate is held by said holding device, such that said electroless plating treatment liquid supply device functions as a lid member for covering the substrate after the electroless plating treatment liquid has been supplied to the surface of the substrate.

6. The electroless plating apparatus according to claim 5, further comprising a mechanism for sucking and recovering electroless plating treatment liquid from the surface, to be plated, of the substrate.

7. A plating apparatus comprising:
- a plating treatment chamber including
  - (i) a holding device for holding a substrate with a surface, to be plated, facing upwardly,
  - (ii) a plating treatment liquid holding mechanism for sealing a periphery of the surface, to be plated, of the substrate while the substrate is held by said holding device, and
  - (iii) a device for supplying plating treatment liquid to the surface, to be plated, of the substrate while being sealed by said plating treatment liquid holding mechanism; and
- a substrate storage chamber provided adjacent to said plating treatment chamber for housing plural substrates to be treated and supplying the substrates to said plating treatment chamber,
- wherein said plating treatment chamber constitutes a thermostatic chamber for maintaining an inner space of said plating treatment chamber at a temperature higher than an exterior temperature, and
- wherein an inner space of said substrate storage chamber constitutes a substrate preheating area for maintaining said inner space of said substrate storage chamber at a temperature substantially equal to the temperature of said inner space of said plating treatment chamber.

8. A plating apparatus comprising:
- a plating treatment chamber for applying a plating treatment to a surface, to be plated, of a substrate by bringing a plating treatment liquid into contact with the surface, to be plated, of the substrate; and
- a substrate storage chamber provided adjacent to said plating treatment chamber for housing plural substrates to be treated and supplying the substrates to said plating treatment chamber,
- wherein an inner space of said plating treatment chamber constitutes a thermostatic chamber for maintaining said inner space of said plating treatment chamber at a temperature substantially equal to a plating treatment temperature, and
- wherein an inner space of said substrate storage chamber constitutes a substrate preheating area for maintaining said inner space of said substrate storage chamber at a temperature substantially equal to the temperature of said inner space of said plating treatment chamber.

* * * * *